US009257516B2

(12) United States Patent
Chen et al.

(10) Patent No.: US 9,257,516 B2
(45) Date of Patent: Feb. 9, 2016

(54) REDUCTION OF OXIDE RECESSES FOR GATE HEIGHT CONTROL

(71) Applicant: GLOBALFOUNDRIES Inc., Grand Cayman (KY)

(72) Inventors: Tsung-Liang Chen, Cohoes, NY (US); Hsin-Neng Tai, Clifton Park, NY (US); Huey-Ming Wang, Ballston Lake, NY (US)

(73) Assignee: GLOBALFOUNDRIES Inc., Grand Cayman (KR)

( * ) Notice: Subject to any disclaimer, the term of this patent is extended or adjusted under 35 U.S.C. 154(b) by 0 days.

(21) Appl. No.: 14/505,582

(22) Filed: Oct. 3, 2014

(65) Prior Publication Data
US 2015/0048446 A1 Feb. 19, 2015

Related U.S. Application Data

(62) Division of application No. 13/896,807, filed on May 17, 2013, now Pat. No. 8,877,580.

(51) Int. Cl.
*H01L 29/423* (2006.01)
*H01L 21/28* (2006.01)
*H01L 27/088* (2006.01)
*H01L 21/8234* (2006.01)

(52) U.S. Cl.
CPC ...... *H01L 29/4236* (2013.01); *H01L 21/28008* (2013.01); *H01L 21/823437* (2013.01); *H01L 27/088* (2013.01); *H01L 29/4232* (2013.01); *H01L 29/42364* (2013.01)

(58) Field of Classification Search
CPC ................................. H01L 29/42364
See application file for complete search history.

(56) References Cited

U.S. PATENT DOCUMENTS

| 5,516,625 | A | 5/1996 | McNamara et al. |
| 7,176,534 | B2 | 2/2007 | Hanafi et al. |
| 7,767,533 | B2 | 8/2010 | Kim |
| 2001/0019886 | A1 | 9/2001 | Bruce et al. |
| 2006/0003518 | A1 | 1/2006 | Harter et al. |
| 2006/0289909 | A1 | 12/2006 | Gluschenkov et al. |
| 2008/0017915 | A1 | 1/2008 | Kwon et al. |

OTHER PUBLICATIONS

Chen et al., "Reduction of Oxide Recesses for Gate Height Control", U.S. Appl. No. 13/896,807, filed May 17, 2013, 19 pages.

*Primary Examiner* — Thanh V Pham
(74) *Attorney, Agent, or Firm* — Heslin Rothenberg Farley and Mesiti PC; Nicholas Mesiti

(57) ABSTRACT

An intermediate semiconductor structure in fabrication includes a substrate. A plurality of gate structures is disposed over the substrate, with at least two of the gate structures separated by a sacrificial material between adjacent gate structures. A portion of the sacrificial material is removed to form openings within the sacrificial material, which are filled with a filler material having a high aspect ratio oxide. The excess filler material is removed. A portion of the gate structures is removed to form gate openings within the gate structures. The gate openings are filled with gate cap material and the excess gate cap material is removed to create a substantially planar surface overlaying the gate structures and the sacrificial material to control sacrificial oxide recess and gate height.

19 Claims, 3 Drawing Sheets

REDUCTION OF OXIDE RECESSES FOR GATE HEIGHT CONTROL

BACKGROUND OF THE INVENTION

1. Technical Field

The present invention generally relates to semiconductor devices and fabrication of the semiconductor devices. More particularly, the present invention relates to controlling gate height by reducing oxide recess and achieving gate height uniformity.

2. Background Information

Gate-first and Gate-last approaches have been two principle approaches for forming semiconductor device gate structures.

In a gate-first fabrication approach, a metal gate is provided over a gate dielectric, and then patterned and etched to form one or more gate structures. After forming the gate structures, source and drain features of the semiconductor devices are provided. In the gate-last approach, a sacrificial (or dummy) gate material is provided, patterned and etched to define one or more sacrificial gates. The one or more sacrificial gates are subsequently replaced with corresponding replacement metal gates, such as, for example, amorphous silicon (a-Si) or polycrystalline silicon, holds the position for the subsequent metal gate to be formed. For instance, an amorphous (a-Si) or polysilicon sacrificial gate material may be patterned and used during initial processing until high-temperature annealing to activate the source and drain features has been completed. Subsequently, the a-Si or polysilicon may be removed and replaced with the final metal gate.

During the fabrication process, a variety of gap fill materials such as, a flowable dielectric material (e.g. flowable oxide) are typically employed in the etched opening in the insulating layer between the adjacent gates, which would later be replaced by contact metal, during the subsequent fabrication processing. However, the quality of the gap fill may typically be poor and may be vulnerable to subsequent wet/dry etch processing. For example, when fabricating replacement metal gates with a tungsten metal gate, a sacrificial material is used between adjacent gate structures along with a fill material, such as a nitride over the entire structure. Subsequent chemical mechanical planarization of the tungsten and/or sacrificial nitride filler material may yield excessive recesses, particularly in the sacrificial material, Such recesses effect the resultant gate height.

Hence, there continues a need for a technique to control gate height, particularly due to oxidation recesses caused by processing of filler material.

SUMMARY OF THE INVENTION

The shortcomings of the prior art are overcome and additional advantages are provided through the provision, in one aspect, of a method of controlling gate oxide recess and gate height uniformity. The method includes providing an intermediate semiconductor structure in fabrication, the structure including a plurality of gate structures disposed over a substrate. The method further includes at least two of the gate structures separated by a sacrificial material between adjacent gate structures and creating substantially planar surface overlaying the plurality of gate structures and the sacrificial material to control sacrificial oxide recess and gate height.

The method may include selectively removing a portion of the sacrificial material between adjacent gate structures to form at least one or more openings within the sacrificial material, filling the at least one or more openings within the sacrificial material with a filler material, patterning a portion of the gate structures to form at least one or more gate openings within the gate structures and providing a plurality of gate caps over the at least one or more gate openings within the gate structures. The method may also include depositing the filler material within the at least one or more openings and over the gate structures and removing excess filler material over the at least one or more openings. And, the method may include depositing the gate caps within the one or more gate openings and extending over the adjacent filler material and removing excess gate cap over the one or more gate structures.

In accordance with another aspect, a semiconductor device is provided, including a substrate, a plurality of gate structures disposed over the substrate, at least two of the gate structures separated by a sacrificial material between adjacent gate structures. The structure may include a plurality of gate caps residing over and being in contact with the gate structures, and a filler material residing over and being in contact with the sacrificial material. The upper surface of the gate caps overlaying the gate structures is substantially planar with the upper surface of the filler material overlaying the sacrificial material so as to control sacrificial oxide recess and gate height.

The semiconductor device may include an intermediate structure which may further include a substrate, a plurality of gate structures, sacrificial material, gate caps and filler material.

These, and other objects, features and advantages of this invention will become apparent from the following detailed description of the various aspects of the invention taken in conjunction with the accompanying drawings.

DETAILED DESCRIPTION OF THE INVENTION

Figure 1:
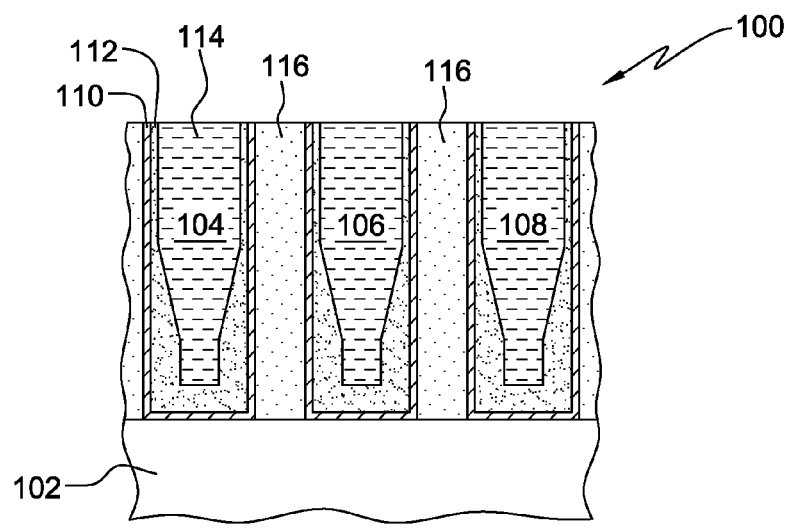
FIG. 1 is a cross-sectional view of one example of an intermediate semiconductor structure including gate structures above a substrate and separated by a sacrificial material, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one example of an intermediate semiconductor structure, generally denoted by 100, obtained during an intermediate stage of semiconductor fabrication. The semiconductor structure 100 may include planar or a fin-type semiconductor structure and the semiconductor structure may, further, include one or more gates. At the stage of fabrication depicted in FIG. 1, the intermediate structure 100 includes a substrate 102, for example, bulk silicon, in one example, the substrate 102 may be any silicon-containing substrate including, but not limited to, silicon (Si), single crystal Si, polycrystalline Si, amorphous Si, silicon-on-insulator substrates, silicon-on-nothing and the like. The semiconductor substrate 102 may include other suitable elementary semiconductors, such as germanium in crystal; a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, AlGaAs, GaInAs, GaInP, or GaInAsp or combinations thereof. The semiconductor substrate 102 may also include isolation regions, various doped regions, other suitable features, and/or combinations thereof.

Continuing with reference to FIG. 1, the intermediate structure 100 may include two or more gate structures 104, 106 and 108 disposed over the substrate 101. Although not critical to the invention, each of the gate structures 104 may include one or more conformally deposited layers such as a gate dielectric layer 110, one or more work function layer(s) 112 disposed over the gate dielectric layer 110 and a gate material 114 disposed over the one or more work function layer(s) 112. The various layers depicted in the figures may be formed from a variety of different materials using a variety of techniques, such as, for example, atomic layer deposition (ALD) and chemical vapor deposition (CVD). The thickness of the gate layers may also vary, depending upon the particular application.

In one example, the gate dielectric layer 110 may be formed of a material such as silicon dioxide or a high-k dielectric material with a dielectric constant k greater than about 3.9 (e.g., k=3.9 for $SiO_2$) and may be deposited by performing a suitable deposition process, such as atomic layer deposition (ALD), chemical vapor deposition (CVD), physical vapor deposition (PVD), or the like. Examples of high-k dielectric materials that may be used in the gate dielectric layer 110 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

One or more work-function layers 112 may be conformally deposited over the gate dielectric layer 110, for example, via a deposition process such as ALD, CVD or PVD. The work-function layer(s) 112 may include, for instance, one or more P-type metals or one or more N-type metals, depending on whether the gate structure is to include, for instance, a PFET or an NHL The work-function layer(s) 112 may include an appropriate refractory metal nitride, for example, those from Groups IVa-VIa in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN), and the like. Although, the gate material 114 may include a metal, such as, for example, aluminum (Al), nickel (Ni), cobalt (Co), and titanium (Ti) and may be conformally deposited over the work function layer(s) 112 using processes, such as for instance, atomic layer deposition (ALD) or chemical vapor deposition (CVD), the gate material, used for the purposes of the present invention, may be tungsten. The gate material 114, in another example, may include polysilicon or polycrystalline silicon.

Continuing further with reference to FIG. 1, the gate structures 104 may be separated by a sacrificial material 116 between the adjacent gate structures 104. The sacrificial layer may be replaced with isolation features such as, for example, shallow isolation features and deep isolation features during the subsequent fabrication. The sacrificial material 116 may include a material with flow characteristics that can provide consistent fill of the opening between the adjacent gate structures, such as, for example, a flowable oxide. In one example, the flowable oxide may include a material, for example, flowable oxide film formed of, e.g., silicon oxide (Si—N—H—C—O or Si—N—H—O) having at least one of N, H and C as impurities, and the flowable oxide may be deposited by a flowable chemical vapor deposition (F-CVD).

As will be subsequently explained, the present invention seeks to control recessing of the sacrificial oxide material and achieve uniformity of the gate structures by protecting the upper surface of sacrificial oxide material with a high aspect ratio oxide that is resistant to further fabrication processing techniques, such as, for example, chemical mechanical polishing and/or etch back processes. This may be accomplished by selectively removing a portion of the sacrificial oxide material and filling the opening within the sacrificial oxide material with a high aspect ratio filler material and removing the excess filler material over the openings. The invention further proceeds to selectively remove a portion of the gate structures and provide the etched portion of the gate structure with a gate cap material. Further fabrication processing such as, chemical mechanical polishing may be performed to achieve the gate height uniformity without affecting the adjacent sacrificial material, that is protected by the filler material.

Figure 2:
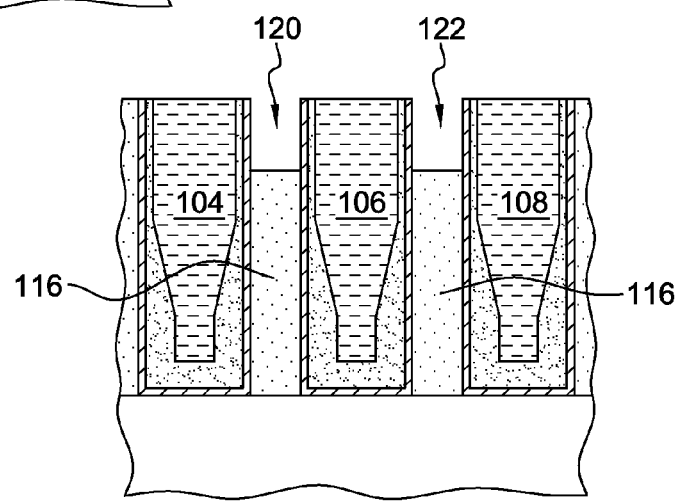
FIG. 2 depicts one example of the intermediate structure of FIG. 1, after selective removal of a portion of the sacrificial material, in accordance with one or more aspects of the present invention.

As noted above and shown in FIG. 2, a portion of the sacrificial material 116 between the adjacent gate structures 104 may be selectively removed to form one or more openings 120 and 122 within the sacrificial material. Any suitable etching process, such as anisotropic dry etching process, for example, SiCoNi etch process, may be employed to selectively remove a portion of the sacrificial material 116. In one specific example, a dry etching process may be employed to remove the sacrificial material oxide by using gas mixtures such as, for example, ammonia ($NH_3$) and nitrogen trifluoride ($NF_3$) in a plasma processing chamber. In another example, a directional anisotropic dry etching step such as, for example, reactive ion etching (RIE) may be performed using fluorine based chemistry and involving process gases such as tetrafluoromethane ($CF_4$), trifluoromethane ($CHF_3$), difluoromethane ($CH_2F_2$), fluoromethane ($CH_3F$), octofluorocyclobutane ($C_4F_8$), hexafluoro-1,3-butadiene ($C_4F_6$), sulfur hexafluoride ($SF_6$) and oxygen ($O_2$). Alternately, an isotropic wet etching process may also be employed using chemical etchants such as, potassium hydroxide (KOH), tetramethylammonium hydroxide (TMAH) and ethylenediamine pyrocatechol (EDP). The portion of the sacrificial material that is etched or otherwise removed may extend, for example, about 150 nanometers to about 200 nanometers into the sacrificial material.

Figure 3:
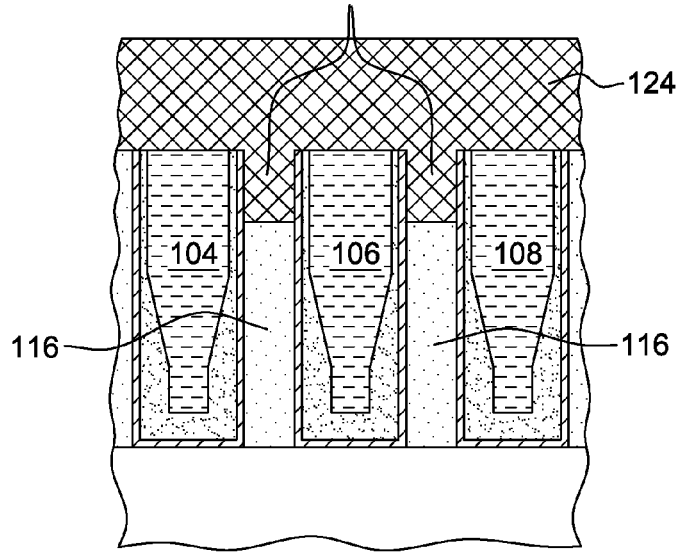
FIG. 3 depicts one example of the intermediate structure of FIG. 2, after selective removal of a portion of the sacrificial material, in accordance with one or more aspects of the present invention.

As illustrated in FIG. 3, a filler material 124 may then be conformally deposited in the one or more openings 120 and 122 created within the sacrificial material 116 and extended above the adjacent gate structures 104, 106 and 108. The filler material 124 may include a high aspect ratio oxide and the thickness of the filler material above the sacrificial material may be, for example, such as to allow subsequent planarization. In one example, the high aspect ratio oxide used as filler material 124 may include a very dense and high quality silicon dioxide such as, for example, high density plasma silicon dioxide (HDP-oxide) which may be deposited using a conventional chemical vapor deposition (CVD) process combined with a simultaneous sputtering process. In a specific example, the silicon dioxide may be deposited and may be simultaneously sputtered or etched by a high density plasma using a gas mixture including silane, oxygen and argon. The high aspect ratio oxide such as, for example, high density plasma oxide (HDP-oxide) is resistant to the conventional processing techniques such as, for example, etching processes, used for the removal of the sacrificial material 116.

Figure 4:
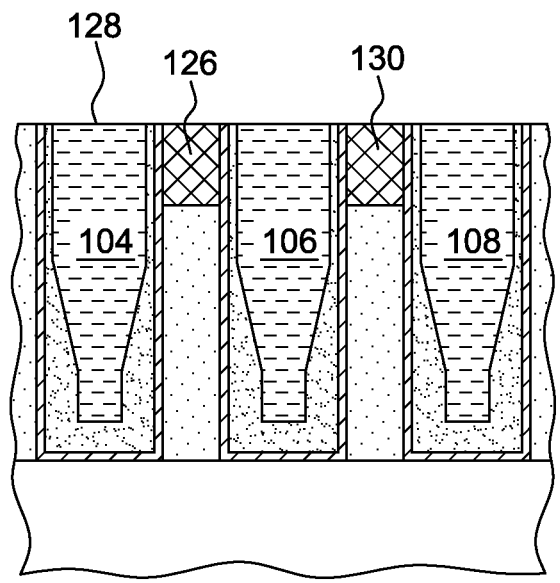
FIG. 4 depicts one example of the intermediate structure of FIG. 3, after deposition of a filler material, in accordance with one or more aspects of the present invention.

The excess filler material 124 may then be selectively removed, as depicted in FIG. 4, using the gate structures 104, 106 and 108 as an etch stop. The removal of the filler material may be performed by conventional techniques well known in the art, such as, for example, chemical mechanical polishing or conventional etch back process, to create a relatively substantially planar surface 128 and leaving the filler material 124 into the one or more openings 126. In a specific example, chemical mechanical polishing may be performed to expose the upper surfaces 130 of the one or more openings 126 filled with the filler material 124, upon which the polishing process may be stopped. The rigorous process conditions such as, for example, polishing rate, polishing down force, and slurry flow rate, employed during the chemical mechanical polishing will control the recessing of the filler material and provide gate height uniformity.

Figure 5:
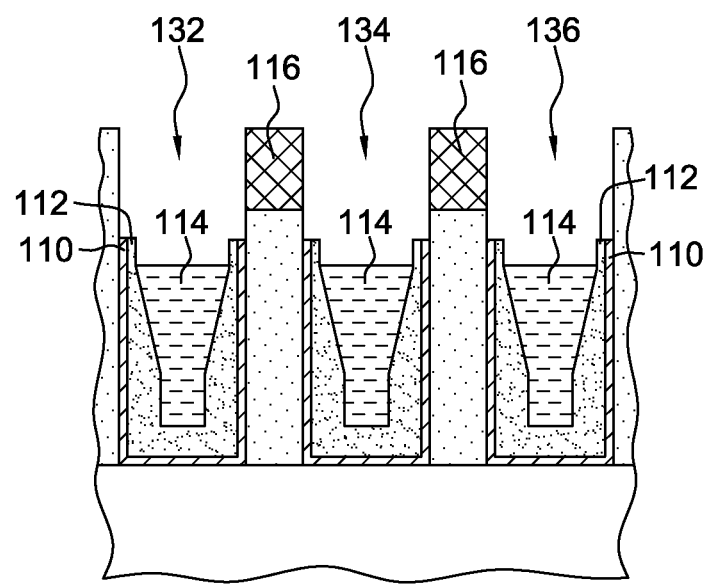
FIG. 5 depicts one example of the intermediate structure of FIG. 4, after removal of excess filler material, in accordance with one or more aspects of the present invention.

As illustrated in FIG. 5, a portion of the gate material 114 may then be selectively removed, to form one or more gate openings 132, 134 and 136. The portion of the gate material may be removed, without affecting the adjacent filler material 116, However, the upper portions the gate dielectric layer 110 and the one or more work-function layers 112 may be selectively removed so that the top of these layers 110, 112 are above the gate material 114. The removal of the gate material 114 may be performed using a conventional process, such as, for example, directional anisotropic etching process, for example, reactive ion etching. In a specific example, the portion of the gate material 114, having a metal gate such as, for example, tungsten may be etched to a depth of about 80 nanometers to about 140 nanometers, using reactive ion etching process involving etchant gases such as, for example, chlorine ($Cl_2$), sulfur hexafluoride ($SF_6$) and/or nitrogen ($N_2$). In a specific example, the portion of the gate material 114, having a metal gate such as, for example, tungsten may be etched to a depth of about 110 nanometers. A portion of the work function layer 112 and the dielectric layer 110 may also be recessed along with the gate material 114 during the recessing of the gate material 114. For example, the work function metal and high-k dielectric materials will be consumed during the Tungsten ("W") metal recess, Typically, for every unit of height of W removed, half of that amount of work function metal and high-k dielectric materials will be removed. So, for example, for 200 A of W recess results in 100 A of high-k/WF removal or height loss.

Figure 6:
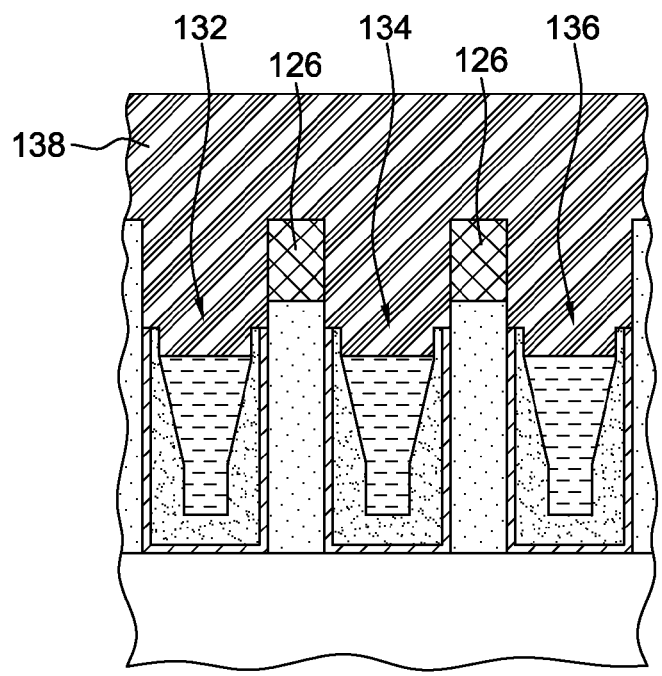
FIG. 6 depicts one example of the intermediate structure of FIG. 5, after deposition of a gate cap material, in accordance with one or more aspects of the present invention.

A gate cap material 138 may conformally be deposited in the one or more gate openings 132, 134 and 136, created within the gate structures and extended above the openings 126 filled with the filler material, as depicted in FIG. 6. As is understood in the art, the gate cap material is deposited to prevent short-circuiting, other-wise known as contact-to-gate (CTG) shorts, when the gate metal comes into contact with the contact material, during subsequent fabrication processing. The gate cap material 138 may, thus include an insulator material such as, for example, silicon nitride and the thickness of the gate cap material extending above the filler material 126 may be, for example, such as to allow subsequent planarization.

Figure 7:
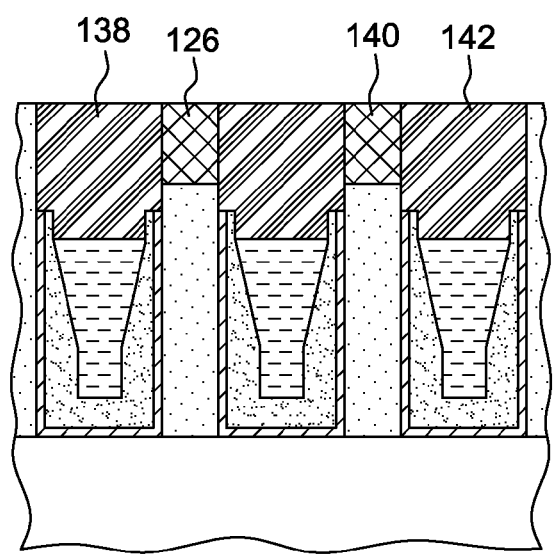
FIG. 7 depicts one example of the resultant structure of FIG. 6, after removal of excess gate cap material, in accordance with one or more aspects of the present invention.

As is shown in FIG. 7, the excess gate cap material 138 is then selectively removed, using the opening filled with the filler material 126 as an etch stop. The removal of the excess gate cap material may be performed using conventional techniques such as chemical mechanical polishing or an etch back process to create a relatively planar surface 140 of the gate material 138 with the filler material 126 and to leave the gate cap material 138 into one or more of the gate openings 132, 134 and 136. In one example, chemical mechanical polishing may be employed to expose the upper surfaces 142 of the one or more gate openings filled with the gate cap material 138, upon which the polishing process may be stopped. The semiconductor fabrication process may be continued further, for example, by removing the sacrificial material 116 and forming contacts by conventional contact etch processes, through contact metallization in the place of the sacrificial material.

Advantageously, as discussed above, the present invention controls recessing of the sacrificial material 116 by protecting the upper surface of the sacrificial oxide material with a high aspect ratio oxide 124 and minimizing/reducing the oxidation in the sacrificial material. The present invention further controls the gate height uniformity by creating a substantially planar surface between the gate structures protected by the gate caps and the sacrificial material protected by the high aspect ratio oxide.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor device comprising:
   at least one gate structure disposed over a substrate, the at least one gate structure comprising recessed, multiple gate layers disposed therein, and a gate cap disposed over the recessed, multiple gate layers;
   a sacrificial material deposited adjacent to the at least one gate structure, the sacrificial material being recessed below an upper surface of the at least one gate structure;
   a filler material disposed over the recessed sacrificial material; and
   wherein said upper surfaces of the gate cap disposed over the recessed, multiple gate layers and the filler material disposed over the recessed sacrificial material are coplanar.

2. The semiconductor device of claim 1, wherein an upper surface of the recessed, multiple gate layers is substantially lower than an upper surface of the recessed sacrificial material.

3. The semiconductor device of claim 1, wherein the gate cap comprises a first material, and the filler material comprises a second material, the first and second materials being different materials.

4. The semiconductor device of claim 3, wherein the first material comprises a nitride material, and the second material comprises an oxide material.

5. The semiconductor device of claim 1, wherein the sacrificial material comprises a first oxide material, and the filler material comprises a second oxide material, the first oxide material, and the second oxide material being different oxide materials, and the second oxide material being denser than the first oxide material.

6. The semiconductor device of claim 5, wherein the first oxide material comprises a flowable oxide, and the second oxide material comprises a high density plasma oxide.

7. The semiconductor device of claim 1, wherein the recessed, multiple gate layers comprises a recessed gate dielectric layer, and a recessed work-function layer disposed within the recessed gate dielectric layer, and the semiconductor device further comprises a recessed gate material disposed within the recessed one or more work-function layers and the recessed gate dielectric layer.

8. The semiconductor device of claim 7, wherein upper surfaces of the recessed gate dielectric layer and the recessed work-function layer are coplanar.

9. The semiconductor device of claim 7, wherein an upper surface of the recessed gate material is non-planar with an upper surface of the recessed work-function layer and an upper surface of the recessed gate dielectric layer.

10. The semiconductor device of claim 7, wherein the recessed gate dielectric layer comprises a high-k gate dielectric layer, the recessed work-function layer comprises a metal work-function layer, and the recessed gate material comprises a metal gate material.

11. A semiconductor device comprising:
    a plurality of gate structures disposed over a substrate, and each of the plurality of gate structures comprising recessed, multiple gate layers disposed therein, and a gate cap disposed over the recessed, multiple gate layers;
    a sacrificial material deposited adjacent to the plurality of gate structures, the sacrificial material being recessed below an upper surface of the plurality of gate structures;
    a filler material disposed over the recessed sacrificial material; and
    wherein said upper surfaces of the gate cap disposed over the recessed, multiple gate layers and the filler material disposed over the recessed sacrificial material are coplanar.

12. The semiconductor device of claim 11, wherein the gate cap comprises a first material, and the filler material comprises a second material, the first and second materials being different materials.

13. The semiconductor device of claim 11, wherein the first material comprises a nitride material, and the second material comprises an oxide material.

14. The semiconductor device of claim 11, wherein the sacrificial material comprises a first oxide material, and the filler material comprises a second oxide material, the first oxide material and the second oxide material being different oxide materials, and the second oxide material being denser than the first oxide material.

15. The semiconductor device of claim 14, wherein the first oxide material comprises a flowable oxide, and the second oxide material comprises a high density plasma oxide.

16. The semiconductor device of claim 11, wherein the recessed, multiple gate layers comprises a recessed gate dielectric layer, and a recessed work-function layer disposed within the recessed gate dielectric layer, and the semiconductor device further comprises a recessed gate material disposed within the recessed one or more work-function layers and the recessed gate dielectric layer.

17. The semiconductor device of claim 16, wherein an upper surface of the recessed gate material is non-planar with an upper surface of the recessed work-function layer and an upper surface of the recessed gate dielectric layer.

18. The semiconductor device of claim 16, wherein the recessed gate dielectric layer comprises a high-k gate dielectric layer, the recessed work-function layer comprises a metal work-function layer, and the recessed gate material comprises a metal gate material.

19. A semiconductor device comprising:
    at least one gate structure disposed over a substrate, the at least one gate structure comprising recessed, multiple gate layers, the recessed, multiple gate layers comprising recessed gate dielectric layer, a recessed work function layer within the recessed gate dielectric layer, and a gate cap disposed over the recessed, multiple gate layers;

a sacrificial material deposited adjacent to the at least one gate structure, the sacrificial material being recessed below an upper surface of the at least one gate structure;

a filler material disposed over the recessed sacrificial material; and wherein said upper surfaces of the gate cap disposed over the recessed, multiple gate layers and the filler material disposed over the recessed sacrificial material are coplanar.

* * * * *